(12) United States Patent
Mathiassen et al.

(10) Patent No.: US 7,251,351 B2
(45) Date of Patent: Jul. 31, 2007

(54) SENSOR UNIT, ESPECIALLY FOR FINGERPRINT SENSORS

(75) Inventors: Svein Mathiassen, Heggedal (NO); Jon Nysaether, Oslo (NO); Bjorn Erik Seeberg, Oslo (NO); Ovidiu Vermesan, Stabekk (NO)

(73) Assignee: Idex ASA, Fornebu (NO)

( * ) Notice: Subject to any disclaimer, the term of this patent is extended or adjusted under 35 U.S.C. 154(b) by 666 days.

(21) Appl. No.: 10/297,746

(22) PCT Filed: Jun. 8, 2001

(86) PCT No.: PCT/NO01/00238

§ 371 (c)(1),
(2), (4) Date: Mar. 31, 2003

(87) PCT Pub. No.: WO01/99035

PCT Pub. Date: Dec. 27, 2001

(65) Prior Publication Data

US 2003/0161512 A1    Aug. 28, 2003

(30) Foreign Application Priority Data

Jun. 9, 2000    (NO) ................................. 20003004

(51) Int. Cl.
*G06K 9/00*    (2006.01)
(52) U.S. Cl. .................................................... 382/124
(58) Field of Classification Search ........ 382/115–116, 382/124–126; 235/380, 382, 382.5; 340/5.53, 340/5.83
See application file for complete search history.

(56) References Cited

U.S. PATENT DOCUMENTS 5,371,404 A    12/1994    Juskey et al.

(Continued)

FOREIGN PATENT DOCUMENTS

WO    WO 98/52157    * 11/1998

(Continued)

OTHER PUBLICATIONS

Balde et al.; "Electronic Materials Handbook, ASM International, vol. 1, Packaging."; pp. 144-145, 297-305, 320-321, 438-442, ISNBN 0-87170-285-1, 1989.

(Continued)

*Primary Examiner*—Vikkram Bali
(74) *Attorney, Agent, or Firm*—Rothwell, Figg, Ernst & Manbeck, PC

(57) ABSTRACT

Sensor chip, especially for measuring structures in a finger surface, characterized in that it comprises an electronic chip of a per se known type being provided with a number of sensor electrodes for capacitance measurements, the chip being positioned on an electrically insulating substrate being provided with a number of openings through which electrical conductors are provided, the ends of said conductors constituting a sensor array for capacitance measurements so that the sensor array is positioned on a first side of said substrate and the electronic chip is positioned on the other side of the substrate.

18 Claims, 3 Drawing Sheets

U.S. PATENT DOCUMENTS

| | | | |
|---|---|---|---|
| 5,399,898 | A | 3/1995 | Rostoker |
| 5,862,248 | A | 1/1999 | Salatino et al. |
| 5,963,679 | A | 10/1999 | Setlak |
| 6,020,749 | A | 2/2000 | Morris et al. |
| 6,026,564 | A | 2/2000 | Wang et al. |
| 6,069,970 | A | 5/2000 | Salatino et al. |
| 6,785,407 | B1 * | 8/2004 | Tschudi et al. ............. 382/124 |

FOREIGN PATENT DOCUMENTS

| | | |
|---|---|---|
| WO | WO 98/58342 | * 12/1998 |

OTHER PUBLICATIONS

Baumgärtner, A. et al.; "Advanced Multichip Module Technologies."; In: Proceedings of the 9$^{th}$ European Hybrid Microelectronics Conference, ISHM. International Society for Hybrid Microelectronic, Jun. 1993, pp. 200-207.

Drüeke, Klaus; "A Sealing Process for Printed-Through Holes." In: Proceedings of the 9$^{th}$ European Hybrid Microelectronics Conference, ISHM. International Society for Hybrid Microelectronic, Jun. 1993, pp. 115-122.

* cited by examiner

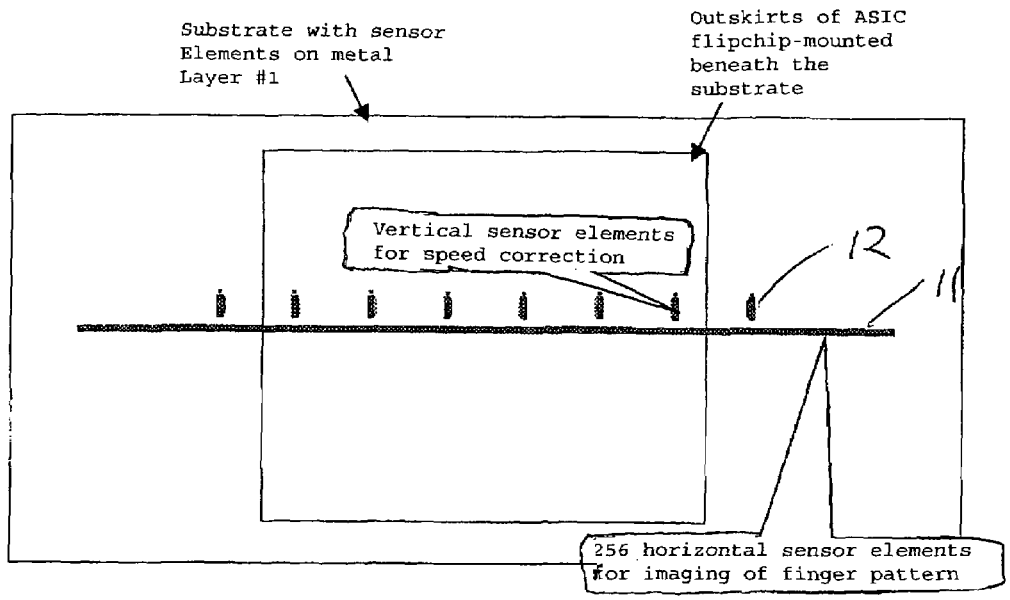
Figure 3 Positioning of sensor elements (imaging elements and elements for speed correction) on the first metal layer on the upper side of the substrate
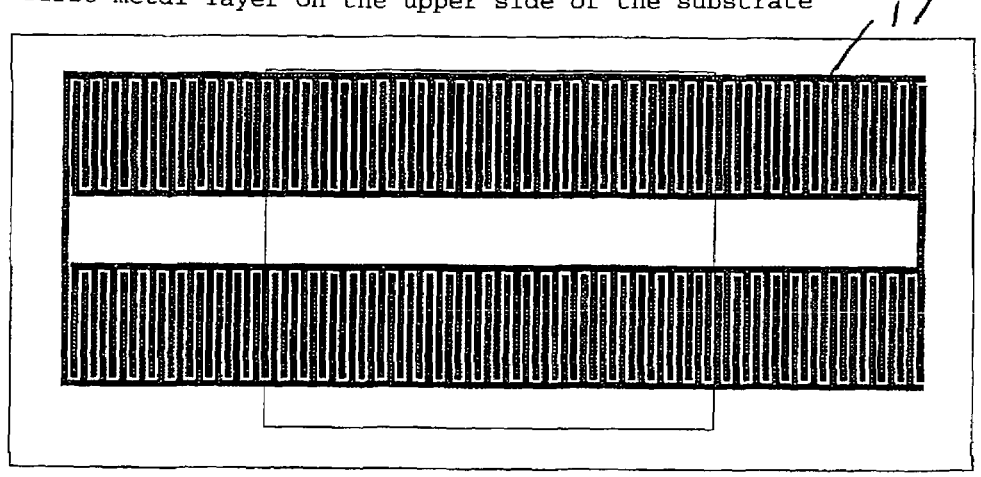
Figure 4 Positioning of modulation ring/activation cell on the upper metal layer on the upper side of the substrate.

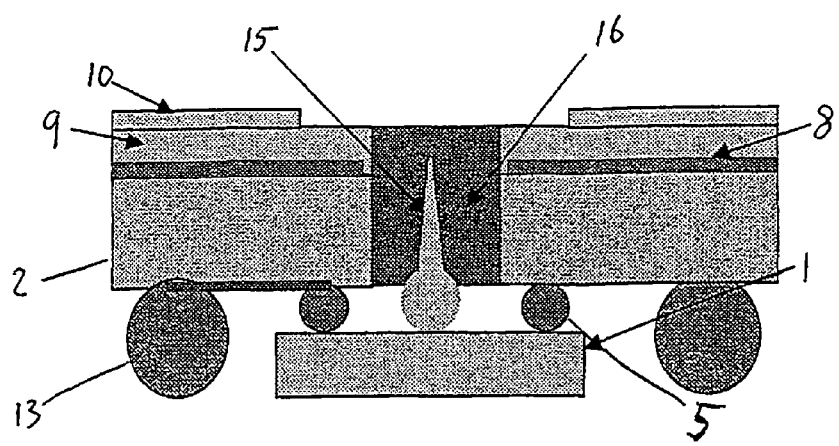
Figure 5
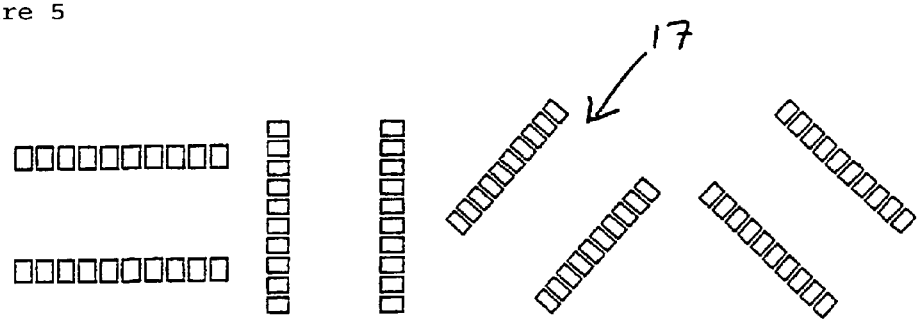
Figure 6 Suggested organising of sensor elements for measuring the finger speed and drag direction. The figure also includes 4 structures with different orientation, each constituting two lines of sensor elements

SENSOR UNIT, ESPECIALLY FOR FINGERPRINT SENSORS

This invention relates to a miniature sensor chip for measuring structures in a surface, especially for measuring structures in a finger surface.

Finger print sensors based on capacitive coupling of an AC signal from the finger surface to a matrix sensor elements are well known e.g. international application No. PCT/NO98/00182. U.S. Pat. Nos. 5,963,679 and 6,069,970 describes similar sensors based on different measuring principles and with two dimensional sensor matrixes.

For specialized applications, e.g. being mounted in mobile phones or a lap-top PC, it is, however, important to make the sensors as small as possible. Such miniature sensors will also be cost effective if produced using, production processes suitable for mass production.

Production of integrated circuits in silicon is a method which in this way combines miniaturization with low production costs. U.S. Pat. Nos. 5,963,679 and 6,069,970, as well as Shigematsu et al, "A 15×15 $mm^2$ Single-Chip Fingerprint Sensor and identifier using Pixel-Parallel Processing", 1999 IEEE International Solid state Circuits Conference, TA 7.5, (1999) and Inglis et al, "A robust, 1.8 V 250 µW Direct-Contact 500 dpi Fingerprint Sensor", 1998 IEEE International Solid state Circuits Conference, SA 17.7, (1998) describes such capacitive finger print sensors in which the main issue is to integrate the capacitive sensor elements with amplifier and electronic circuits for signal treatment in a single circuit in silicon or some other semiconductor material. In addition to the high degree of miniaturization this concept provides advantages related to signal quality as the amplifier electronics may be positioned close to the capacitance sensitive elements in the sensor matrix. The sensitivity to noise and parasitic capacitive couplings may thus by reduced to a minimum.

The disadvantage related to such "integrated" sensors is, however that such semiconductor circuits are not suitable for having direct contact with the environment, and usually has to be provided with a housing protecting the circuits from humidity, wear, corrosion, chemical substances, electronic noise, mechanical influences, sun light electric discharges etc. U.S. Pat. No. 5,862,248 provides a possible solution to this problem, in which the circuit is enclosed in such a way that the finger is allowed to direct contact with the sensitive surface of the sensor through an opening in the top of the enclosure.

In many cases this solution will not sufficient to provide the required reliability. The materials (metal, dielectrics) being used on the surface of the integrated circuits are usually not sufficiently reliable to withstand exposure from the outer environment and contact with the finger over a longer period of time, and thus this solution will also lead to reliability problems. The problems may be reduced by adding additional layers of metal and dielectrics on the chip surface, as described in U.S. Pat. No. 6,069,970. Such layers will however increase the production costs and create compatibility problems with the semiconductor process in general (related to processing temperature, varying dimensions due to temperature etc).

Another problem with the housing described in U.S. Pat. No. 5,862,248 is that the opening leading down to the surface of the circuit provides a difference in height between the sensitive surface of the sensor and the housing surface in general, which is unfortunate in use. At the same time the described method may require nonstandard and expensive packing processes for mounting and coupling of the sensor circuit.

U.S. Pat. Nos. 5,963,679 and 6,069,970, as well as the articles referred to above, are all based on a two dimensional matrix principle. A disadvantage is that the sensors may be to expensive for a number of applications since they need a silicon area with a size in the range of 12*12 mm to be able to provide an image of the whole fingerprint. The production price of the integrated circuits is approximately proportional with the silicon area so that a reduction in this area will save expenses.

The problem with such a silicon area may to a certain degree be avoided with so called "line sensors" or scanners (international patent application No PCT/NO98/00182) consisting of one or more lines ("one dimensional" matrix) of sensor elements. The thought is that such sensors may provide an image of a finger being moved over the sensor. By sampling the signal from the sensor elements at chosen time intervals and measuring the velocity of the finger the structure of the fingerprint may be determined. Thus the integrated circuit, which must be as long as the width of the fingerprint, may be much narrower and thus have far less area than the corresponding sensor being based on a two-dimensional matrix. Production experience, however, shows that such long, narrow silicon circuits are difficult to deal with and therefore have percentage of breakage in the production, while at the same time being weaker when subject to external influences such as the force from a finger surface.

The object of this invention is to secure a cost effective miniature sensor solution both eliminating the technical risk at exposing of the sensor to the external environment, which may be realized without the use of specialized or non-standard packing technology, which eliminates the need for an integrated electronic circuit of the same size as the fingerprint one whished to map, and in which this circuit does not need to be as long as the finger width. This object is obtained using a sensor chip as described above and being described in the independent claim 1.

The invention thus relates to a substrate constituting an interface against the users fingers, integrated with a semiconductor circuit on the opposite side of the substrate comprising amplification and signal treatment electronics for reading of the signals from the finger. The principle is based on a positioning of the imaging sensor elements on the upper side of the substrate, and that they are coupled to the interrogation electronics on the opposite side of the substrate through so called vias. The interrogation electronics is preferably a "naked" (unpacked) integrated silicon circuit (ASIC) being mounted on the backside of the substrate using well known technology.

Ceramic substrates with costumer specified vias are commercially available both as ceramic plates with drilled or metal filled holes and as so called LTCC (Low Temperature Cofired Ceramic) structures. The cost per area for such ceramic substrates is at the present significantly lower than the production costs for silicon circuits. Such a hybrid solution will thus provide a very compact sensor with lower production costs than for an integrated sensor combined with conventional packing types of plastic or ceramics.

By routing conductors from the positions of the sensor elements to the interrogation input contacts, either on the front or backsides of the substrate, one will also make the area of the interrogation circuit independent of the sensor shape. Thus it is possible to use an interrogation circuit with any shape and size. This will give reduce production costs significantly. In addition to such a cost effective the combination of substrate and semiconductor circuit has the advantage that it eliminates much of the technological uncertainty related to external influences, as the substrate per se will provide a protection from many of the abovementioned influences, and because it has larger flexibility in choosing the materials which are to be in direct contact with the finger considering wear, reliability, humidity absorbency etc.

The present solution also allows elegant implementation of metal electrodes and similar structures on the front side of the substrate to add functionality and secure increased signal quality, such as a modulation electrode (for coupling AC voltage into the finger) and a activation cell for detecting the presence of a finger. Such metal electrodes will also have an important function in leading away the current related to electronic discharges e.g. from the finger.

The present invention is, however, not limited to the use of ceramic substrates. It is also possible to realize the same structure based on substrates of glass, plastic based materials, e.g. circuit boards and silicon.

By using silicon substrates one may also contemplate simple, active components, such as transistors, diodes and resistors to realize e.g. preamplifiers and other components directly into the substrate, either on the front or back sides of the substrate. In the latter case it may also be advantageous to use silicon processes being substantially less expensive per area than typical processes being used for producing integrated circuits, such as CMOS or BiCMOS. Such a solution with an "active" silicon substrate has common features with some of the abovementioned patents in which the sensor is based on an integrated circuit. The suggested concept differs, however, from these patents in the use of vias through the silicon substrate in order to lead the signals from the elements to a signal treatment circuit on the rear side of the substrate.

The present invention will be described in more detail with reference to the accompanying drawings, illustrating the invention by way of example.

FIG. 3 shows a sketch of the distribution of sensor points according to a preferred embodiment of the invention.

FIG. 4 shows a combined modulation electrode and activation cell for positioning on a sensor chip according to the invention.

FIG. 5 shows a variant of the alternative embodiment illustrated in FIG. 2.

FIG. 6 shows a possible embodiment of the sensor array if used in applications for navigation/mouse.

Figure 1:
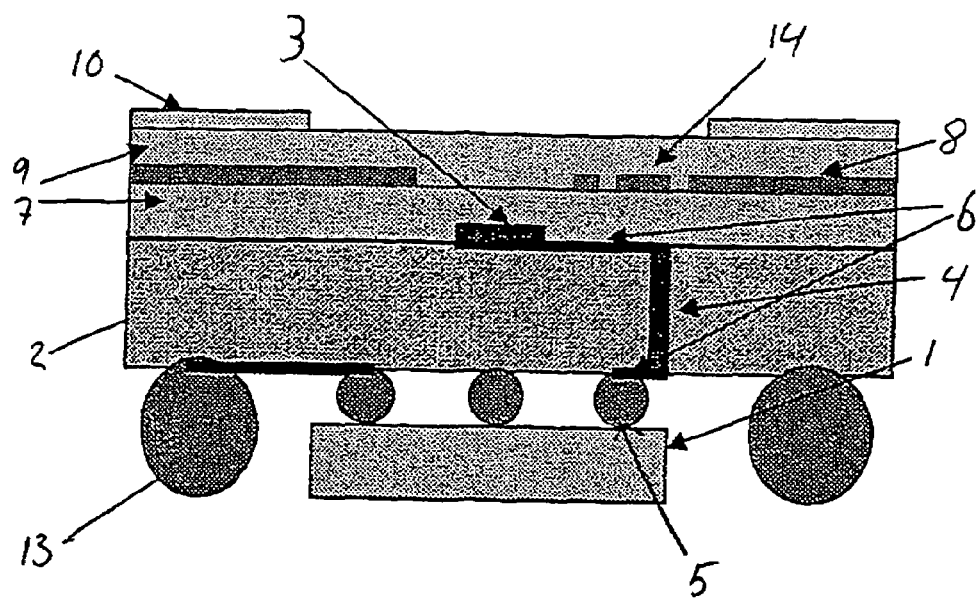
FIG. 1 shows a cross section of a preferred embodiment of the invention (schematically).
Figure 2:
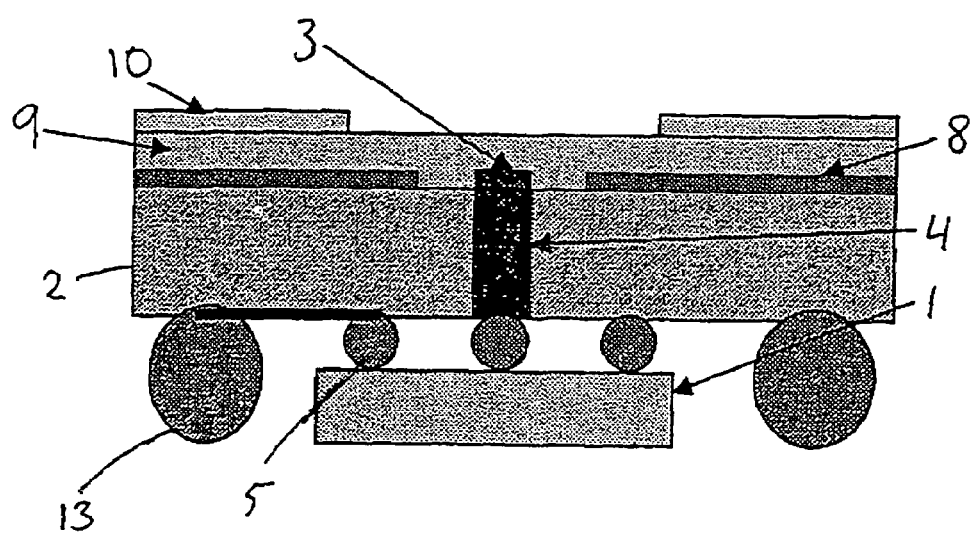
FIG. 2 shows a cross section of an alternative, simplified embodiment of the invention (schematically)

As is clear from FIGS. 1 and 2 the sensor chip according to the invention preferably consists of a naked (unpacked) silicon chip 1 integrated with a ceramic substrate 2 which constitutes the interface against the fingers of the user. The principle is based on that the imaging sensor elements 3 positioned on the front side of the substrate, and that they are coupled to the interrogation electronics on the rear side of the substrate through so called vias 4. As mentioned above the substrate 2 preferably will be made in a ceramic material, but other solutions may also be contemplated, e.g. glass, plastic based materials (e.g. circuit boards/glass fibre laminates) and silicon.

The present combined solution (substrate 2 and naked chip 1) may industrially be integrated by mounting the silicon chip in the back side of the substrate and being coupled to the conductor leads here using well known technology. A very compact solution is obtained using the so called flip-chip technology, e.g. with so called solder bumps 5. Another solution may be to adhere the chip to the substrate and obtain electrical coupling to the substrate by so called wire bonding. One may also contemplate methods in which the silicon circuit is laminated directed to the substrate in a suitable way for obtaining electrical contact. In the case of the silicon substrate it is also possible that the separate electronic circuit is unnecessary as many of the necessary components are integrated directly into the rear side of the substrate.

For electric contacting of input or output interfaces of the sensor chip and mounting of the component on an underlying component carrier the underside of the substrate may be provided with so called BGA (Ball Grid Array) balls 13, also being standard technology.

For providing the necessary functionality for the capacitance based measuring principle the substrate is provided with a number of layers, e.g. as disclosed in FIG. 1. The figure describes a possible solution, and is not limiting relative to other combinations of layers.

The provided layers on the substrate being shown in FIGS. 1 and 2 shows examples of the build of the substrate, and will be explained below. Layered building with thin film or thick film on ceramic or other types of substrates is well known technology, but the individual layers functionality and the combination of these covered by the present invention, especially related to finger print sensors as a variant of the sensor described in the international patent application No. PCT/NO98/00182 comprising an essentially linear sensor array 11, as shown in FIG. 3. FIG. 3 also showing secondary sensor groups 12 which among other things may be used for velocity measurements on a finger moved relative to the sensor, as described in the abovementioned patent application. A line shaped sensor has the great advantage that it need far less room and unique channels than e two dimensional sensor with the same resolution, so that it may be made at lower cost.

In FIG. 1 the first metal layer 6 constitutes the imaging sensor elements 3 and conductor leads 6 from the elements to the vias holes 4 through the substrate 2 to the underlying "solder bumps" 5 over a flip chip mounted ASIC 1. As mentioned the sensor elements may be ordered as described in FIG. 3 as a variant of the patented solution in Norwegian patent No. 304.766 (corresponding to PCT/NO98/00182). The first dielectric layer 7 in FIG. 1 functions as an insulating layer between the conductor leads in the first metal layer and the earth plane of the second electrically conducting layer 8. This layer 7 may cover the whole substrate surface. The layer also constitutes a part of the total dielectric thickness (insulation) between the finger and the sensor element. To maintain the geometric resolution the layer must not be to thick in the area directly over the sensor points. In this area the dielectrics thickness preferably is as large or less than the distance between the sensor point centres. At the same time it must be sufficiently thick to (together with the next dielectric layer and other ESD protecting electronics) to hinder electric conduction (at electrostatic discharges) from the sensor surface to the sensor elements.

Depending on the thickness of the first dielectric layer 7 and the geometry of the conductor leads a parasitic capacitance will arise between the conductor leads and the earth plane which will contribute to a reduction in the total measuring signal. In order to reduce the influence of such a parasitic impedance the layer must have a certain thickness.

One variant of the suggested geometry may be made by providing the dielectric layer 7 with a varying thickness, so that at the thickness is at its least in the area directly above the sensor elements and thicker between the conductor leads in the electrically conducting layer 6 and the earth plane 8.

In the case in which the substrate is made from silicon one may substitute or supplement the measuring capacitance with a reversed biased diode. By changing the voltage over this diode one may change the capacitance of the diode so that the sensitivity of the sensor may be controlled using the preset voltage over the diode. The diode may possibly be constituted by a base emitter in a bipolar transistor being part of a preamplifier.

The second metal layer 8 constitutes an earth plane, or a plane at another predetermined potential, shielding the conductor leads etc against noise and against direct coupling of the AC signal from the finger or from the modulation electrode 10. The earth layer 8 is preferably formed so as to cover all the conductor leads on the underlying first metal layer 6, but must have windows over the sensor elements 3. The openings in the earth plane 8 over the sensor elements 3 contributes in shaping the electrical field by en "lens" effect and thus the capacitive coupling between the finger and the sensor elements. The construction of the sensor element 3 and the opening in the second metal layer may be optimized to maximize the signal strength without reducing the geometric resolution.

One variant of the suggested geometry may be obtained by making via holes further through the first and the second metal layers 6, 8 over the sensor element 3, so that the element is moved up to the second metal layer 8. One may also consider the use of two earth layers for improving the shielding effect. The second dielectric layer should insulated between the earth plane 8 and the outer metal layer 10. The layer also has (together with the electronics for ESD protection) an important function for hindering electrical breakdown (by electrostatic discharges) between the second metal layer and the outer metal layer 10, and thus must have sufficient dielectric characteristics for this purpose. The layer also (as mentioned above) constitutes a part of the total dielectric thickness (insulation) between the finger and the sensor element 3.

For maintaining the sensors geometrical resolution is should however, not be to thick. Since the outer metal layer 10 of electrical reasons does not cover the area over the sensor elements 3 the finger will come in direct contact with the second dielectric layer 9. This layer should thus be hard and wear resistant to withstand wear and breakage, as well lo as chemical influences from the outer environment and from the finger of the users and other objects.

The outer metal layer 10 is the upmost layer if the object is to provide a modulation frequency, as mentioned in international patent application No. PCT/NO98/00182 into the finger for securing good signal quality and as illustrated in FIG. 4. Therefore thus must be electrically conductive with good coupling to the finger, and be shaped that a part of the finger always is in contact with this layer during measurements. At the same time it has to be hard and wear resistant to be able to withstand wear and breakage, as well as chemical influences for the surroundings and from the users fingers. Chrome is a possible metal for this purpose.

The modulation electrode 10 may be coupled to a designated drive circuit (not shown) which in turn may be coupled to the sensors for improved control of the provided modulations, but will preferably be connected to an oscillator constituting a part of the mounted electronic circuits 1. The conductor leads of the modulation electrode 10 may be lead through the different layers and the substrate 2 in the same way as the other conductors 4.

Such a modulation electrode may be combined with an e.g. capacitive activation cell, and may thus be used to control the activation of the sensor from a hibernation state to active use, to minimize the power consumption of the sensor.

A capacitive activation cell may e.g. be made as an interdigitated finger capacitance consisting of two hot mutually interconnected cam structures (electrodes) 17 as shown in FIG. 4. When the conductive object, e.g. a finger, closes inn on this structure the capacitance between the electrodes increase and this change may be detected e.g. by an oscillating circuit being capable of operating with low power consumption. It is also possible that the activation principle may be based on measuring the changes in capacitance between an electrode and the second metal layer 8.

If one of the electrodes in the outer metal layer 10 is earthed as long as the sensor is in hibernation-mode this will also provide an effective protection against ESD discharges from a finger or another charged object, as the discharge thus will be lead directly to earth. Even if one of these electrodes is not coupled to earth the structures in the outer metal layer 10 may have an important function for ESD-protection if it is coupled to ESD-protective circuits, e.g. Zener diodes, between this layer and earth.

Such protective circuits may either be mounted separately on the back side of the substrate or be external relative to the sensor chip.

An alternative method for coupling the modulation frequency to the finger is to cover the electrically conductive material with a thin dielectric film, so that the coupling is capacitive. This may have the advantage that the coupling is more uniform from person to person, and less dependant on the dampness of the finger.

A third variant for coupling of the finger is to provide a modulation ring and an activation cell outside the sensor substrate. This makes the outer metal layer redundant.

As the characteristic of the amplifier and other signal treatment electronic on the interrogation circuit may vary from element to element it will be of great significance to be able to calibrate the response from each sensor element. This may be obtained by providing a transversal electrode 14 close to the line of sensor elements or the conductors leading to them, e.g. as a part of the second metal layer 8. By providing a modulated signal on the electrode the sensor elements will be excited capacitively without a finger or conductive object in the vicinity. Based on the resulting signals from the amplifier and signal treatment electronics it thus will be possible to equalize the response from each sensor element. By providing an inverted AC-signal on this electrode during measurements it will also be possible to realize a differential measuring principle in which the constant capacitive contribution from the dielectric layers 7 and 9 is eliminated from the measurements.

FIG. 2 shows an alternative embodiment in which the openings 3 in the substrate 2 is positioned in the sensor elements chosen positions so that the first dielectric layer 7 covering it is unnecessary. This simplifies the construction and may provide a thinner dielectric layer, but requires a possibility for making vias with the same separation as the sensor elements. This requires e.g. that the vias diameter must be substantially less than the distance between two sensor elements, which for example; may be 50 μm.

The production of the sensor may e.g. be performed using the following methods:

1. Based on "thick film technology":
   Openings through a ceramic substrate (e.g. alumina) is drilled with a laser.
   Metal is printed or plated through the openings to provide electrically conductive vias.
   The conductive layers and dielectrics on the front side of the sensor is patterned with standard thick film technology, e.g. silk printing or by a "print and corrode" process.
   Conductive layer: e.g. gold, silver palladium or copper.
   Dielectrics: e.g. glass-ceramic blends.
   Corresponding processes are used for defining necessary conductor leads and connector points on the other side of the substrate.
   The electronic circuit is mounted by standard methods, such as flip-chip or wire bonding.
   Possible geometric resolution in the sensor array (using the presently available technology): approx. 30-50 µm.

2. Based on low temperature cofired ceramics:
   As above, but the conductor leads through the substrate are made by sequential building in which several layers of ceramics and leads are stacked before sintering. With this technology it is possible to make a "3-dimensional" structure in which the silicon chip may be laid into a cavity underneath the substrate.

3. Based on thin film technology:
   Openings in through a ceramic, glass or silicon substrate is made with a laser, with ceramic drilling or a corrosive process.
   Metal or another conductive material is printed plated or deposited through the openings to provide electrically conductive vias.
   The conductive layers are defined by depositing thin layers of metal (e.g. Al or gold) on the substrate, performing a photo lithographic process and corroding unwanted metal away.
   Dielectrics (polymer or inorganic) is spun or deposited on the substrate and patterned using standard techniques.
   Possible geometric resolution in the sensor array (with the presently available technology): approx. 20 µm.

4. Based on a Printed Circuit Board:
   Printed circuit boards with plated holes are made using standard techniques, including so called sequential buildup.
   The first conductive layer on each side of the substrate are made using standard circuit board corrosion techniques (metal: Copper).
   Other dielectrics and conductive layers are printed using a so called "polymer thick film process". Possible geometric resolution in a sensor array (with present days technology) is approx. 50-100 µm.

5. As 1-4, but in which the conductors does not pass through the substrate as separate vias, but as thin, vertical threads from the surface through one or more slots 16 in the substrate as shown in FIG. 5. The thin threads 15 may be made as so called stud bumps, which is essentially wire bonding threads being cut at a certain height. The through-going slot 16 may be filled afterward with an electrically insulating casting material (e.g. epoxy) which then is levelled at the same height as the substrate surface. This structure requires a correspondence between the contact pattern on the ASIC and the shape of the sensor array.

One may also consider the thin, vertical threads 15 (e.g. in the form of stud bumps) being fastened to the sensor elements on the upper side of the substrate, and that it thereafter is provided with a casting material around the threads so that the thread ends protrude from the casting material. The one may cut the threads at the upper edge of the casting material so as to provide a plane structure. The contact between the finger and the threads will then be ohmic, but has the large advantage that it will not change as the casting material and threads are worn down. To maintain a capacitive measuring principle a capacitive coupling may be contemplated another place in the structure, e.g. by using a capacitive coupling between the structures of two metal layers on the substrate top.

The present invention relates to devices which in a unique way provides the advantages of a solid state fingerprint sensor. Corresponding technology may also be used in other applications demanding recognition of finger movements over a surface, e.g. for navigation/mouse related purposes.

For such applications the sensor array may e.g. consist of several subarrays being oriented in different directions on the sensor surface, each consisting of two line shaped sensor arrays or groups of sensor elements positioned as illustrated in FIG. 6. By correlating the signal between different combinations of sensor pairs and deciding which sensor pairs has correlating signals, with related time difference, it will be possible to decide not only the finger velocity, but also the direction of the finger movement over the sensor.

If a complete image of the whole finger surface is required it is also a problem that flat fingerprint sensors lacks the possibility to make measurements on the sides of the finger. A possibility is therefor to give the sensor surface and the sensor array a U shape being adapted to at least partially enclose the finger surface.

Even if the electrical conducting layers being described here is described as metal layers it is clear that alternative electrical conductors may be used, such as polysilicon, also may be used if the production methods and other characteristics allows it.

The invention claimed is:

1. A sensor unit for measuring structures in a finger surface, comprising an electronic chip including a number of interrogation electrodes for capacitance measurements, said electronic chip being positioned on one side of an electrically insulated substrate provided with a number of openings through which electric conductors are coupled to the interrogation electrodes on the opposite side of said substrate, the ends of said electric conductors forming a sensor array for measuring said structures on said surface, wherein the sensor array is essentially linear and is adapted to measure a relative movement between the array and a finger surface.

2. The sensor unit according to claim 1, in which each opening position is determined by the chosen shape of the sensor array, and thus also defines the locations of the electric conductor ends, and in which the chip further comprises:
   one electrically conductive and earthed layer which includes openings over the electrical conductor ends,
   one dielectric layer covering the electrically conductive layer as well as the conductor ends.

3. The sensor unit according to claim 2, in which one of the conductive layers comprises an electrode being capable of capacitively excite each sensor element, so that the response from each sensor element may be calibrated independently of the presence of a finger or other conductive objective close to the sensor surface.

4. The sensor unit according to claim 2, in which the thickness of the dielectric layer or layers is no more than the distance between the centres of the dielectric conductor ends.

5. The sensor unit according to claim 2, in which the outmost dielectric layer is provided with an outer electrically conductive layers, also comprising openings over the ends of the electric conductor ends, adapted to provide contact with the fingers and being coupled to an electric modulator.

6. The sensor unit according to claim 5 in which the outer electrically conductive layer is provided with an outer dielectric layer for pure capacitive coupling to the finger.

7. The sensor unit according to claim 5, in which the electric modulator constitutes a part of the electronic circuitry in said electronic chip, and is coupled to the outer electrical conductor through at least one of said openings in the substrate.

8. The sensor unit according to claim 5, in which the outer electrically conductive layer contains a structure which changes impedance when being close to an electrically conductive object, which together with a suitable circuit is adapted to activate the sensor when the surface to be measured comes close to the sensor.

9. The sensor unit of claim 8 wherein impedance is capacitance and the surface to be measured is the surface of a finger.

10. The sensor unit according to claim 1, in which the sensor side of the substrate is provided with:
a first electrically conductive layer which at least includes the electrical conductors including their end points,
a first dielectric layer covering the first electrically conductive layer,
a second electrically conductive earthed layer including openings over the ends of the electrical conductors and being electrically insulated from the first electrically conductive layer by the first dielectric layer,
a second dielectric layer covering the second electrically conductive layer, as well as the conductor ends.

11. The sensor unit according to claim 1, wherein the substrate is made from a material from ceramic, glass or glass fibre laminate.

12. The sensor unit according to claim 1, in which the substrate is made from silicon.

13. The sensor unit according to claim 12, in which amplifiers and other electronic circuitry is made in the substrate.

14. The sensor unit according to claim 1, in which the conductor ends are in direct contact with the finger and that the measuring capacitance is coupled between the conductor ends and the interrogation electrodes in the electronic circuit.

15. The sensor unit according to claim 1, in which the capacitance of the sensor array may be adjusted electronically for adjusting the signal strength.

16. The sensor unit according to claim 1, in which the surface of the chip is U shaped.

17. A sensor unit for measuring structures in a finger surface, comprising
an electrically insulating substrate including a plurality of holes passing through the substrate,
an electronic chip including a plurality of interrogation electrodes for capacitance measurement, and
a plurality of electric conductors arranged to form a sensor array,
wherein the electronic chip is disposed on one side of the substrate and the electric conductors are disposed on the other side of the substrate, the interrogation electrodes and electric conductors are connected through the holes, and the sensor array is essentially linear and is adapted to measure a relative movement between the array and a finger surface.

18. The sensor unit according to claim 17, in which the surface of the chip is U shaped.

* * * * *